United States Patent
Arndt et al.

(10) Patent No.: US 7,435,997 B2
(45) Date of Patent: Oct. 14, 2008

(54) COMPONENT COMPRISING A LARGE NUMBER OF LIGHT-EMITTING-DIODE CHIPS

(75) Inventors: Karlheinz Arndt, Regensburg (DE); Georg Bogner, Lappersdorf (DE); Herbert Brunner, Regensburg (DE); Gunter Waitl, Regensburg (DE)

(73) Assignee: Osram GmbH, Munich (DE)

( * ) Notice: Subject to any disclaimer, the term of this patent is extended or adjusted under 35 U.S.C. 154(b) by 652 days.

(21) Appl. No.: 10/362,554

(22) PCT Filed: Aug. 22, 2001

(86) PCT No.: PCT/DE01/03198

§ 371 (c)(1), (2), (4) Date: Sep. 29, 2003

(87) PCT Pub. No.: WO02/17401

PCT Pub. Date: Feb. 28, 2002

(65) Prior Publication Data

US 2004/0056265 A1 Mar. 25, 2004

(30) Foreign Application Priority Data

Aug. 24, 2000 (DE) .............................. 100 41 686

(51) Int. Cl.
H01L 21/00 (2006.01)

(52) U.S. Cl. .................... 257/98; 257/99; 257/100; 257/E25.02; 257/E33.056

(58) Field of Classification Search ................. 257/93, 257/94, 95, 96, 97, 98, 99, 100, E25.02, E33.056, 257/E33.057

See application file for complete search history.

(56) References Cited

U.S. PATENT DOCUMENTS

| 5,032,960 | A | * | 7/1991 | Katoh | 362/240 |
| 5,093,768 | A | * | 3/1992 | Ohe | 362/241 |
| 5,340,993 | A | * | 8/1994 | Salina et al. | 250/551 |
| 5,534,718 | A | | 7/1996 | Chang | |
| 2001/0048814 | A1 | * | 12/2001 | Lenmann et al. | 396/154 |

FOREIGN PATENT DOCUMENTS

| DE | 3719338 | | 12/1988 |
| DE | 197 4 893 | | 5/1999 |
| JP | 0593983 | * | 1/1984 |
| JP | 59067674 | | 4/1984 |
| JP | 59-112665 | | 6/1984 |
| JP | 63081873 | | 4/1988 |
| JP | 02058089 | | 2/1990 |
| JP | 05275747 | | 10/1993 |
| JP | 06077540 | | 3/1994 |
| JP | 06216411 | * | 8/1994 |
| JP | 07015044 | | 1/1995 |
| JP | 07121123 | | 5/1995 |
| JP | 07176791 | | 7/1995 |
| JP | 07176791 S | | 7/1995 |
| JP | 11307818 | | 11/1999 |

* cited by examiner

Primary Examiner—Sue A. Purvis
Assistant Examiner—Fazli Erdem
(74) Attorney, Agent, or Firm—Cohen Pontani Lieberman & Pavane LLP

(57) ABSTRACT

A device (1) with a number of light emitting diode chips (5) in a reflector (3) is formed in such a way that the direct line of sight between the light emitting diode chips (5) is interrupted by a partition (11). This improves the efficiency of the device (1) substantially.

22 Claims, 2 Drawing Sheets

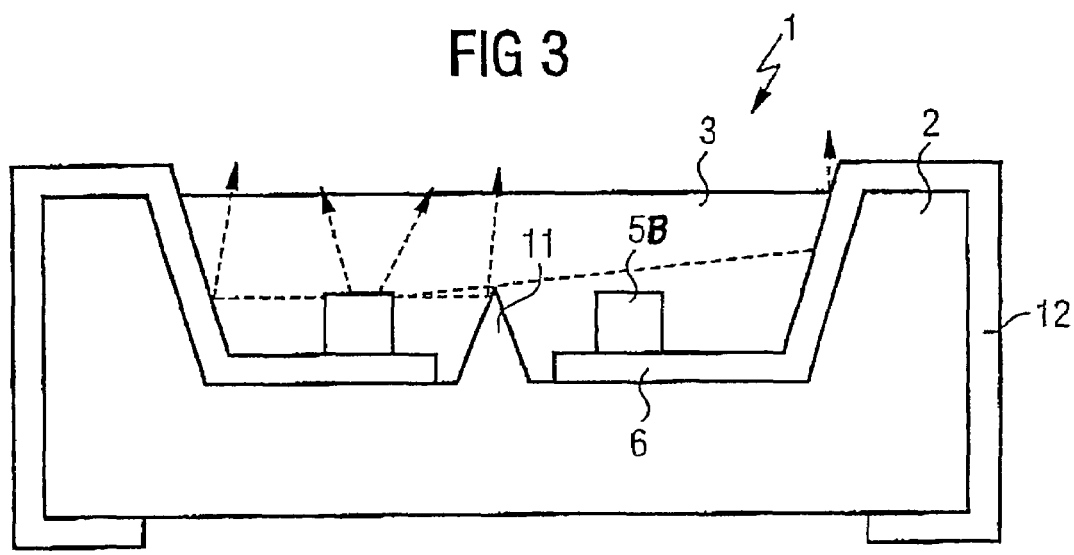

COMPONENT COMPRISING A LARGE NUMBER OF LIGHT-EMITTING-DIODE CHIPS

This application is a U.S. National Phase Application under 35 USC 371 of International Application PCT/DE01/03198 filed Aug. 22, 2001.

FIELD OF THE INVENTION

The invention relates to an optoelectronic component having a plurality of light emitting diode chips which are arranged together in a common reflector.

BACKGROUND OF THE INVENTION

These types of devices are widely known. Since light emitting diode chips can emit light in various colors, the devices can be used to emit multicolored light. Furthermore, since the light emitting diodes are arranged together in the same reflector, the device remains relatively small despite the multicolored nature of the light emitted.

However, the light yield of the known devices remains below the total light yields of the individual light emitting diode chips.

SUMMARY OF THE INVENTION

It is one object of the invention to provide a light emitting diode chip device with an improved light yield.

This and other objects are attained in accordance with one aspect of the invention directed to an optoelectronic device, having a plurality of light emitting diode chips (5), which are arranged adjacent to one another in a common reflector (3). A partition (11) is disposed between any two light emitting diode chips (5).

Since the direct line of sight between the light emitting diode chips in the device according to the invention is interrupted by baffles, only a tiny fraction of the radiation emitted by a light emitting diode chip is absorbed by the other light emitting diode chips. By taking these measures, a major source of occurring losses is eliminated. The light yield of the device according to the invention is therefore essentially the same as the total of the light yields of the individual light emitting diode chips.

BRIEF DESCRIPTION OF THE DRAWINGS

FIG. 3, a cross-sectional view through a modified exemplary embodiment of the device.

DETAILED DESCRIPTION OF THE DRAWINGS

Figure 1:
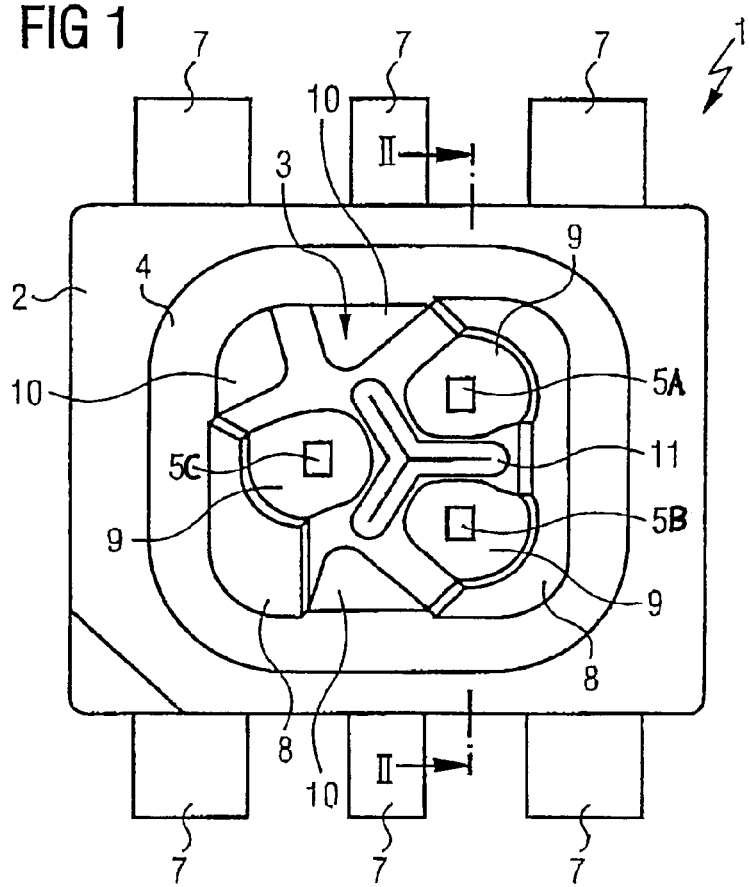
FIG. 1, a top view of a device that can be equipped with a number of light emitting diode chips.
Figure 2:
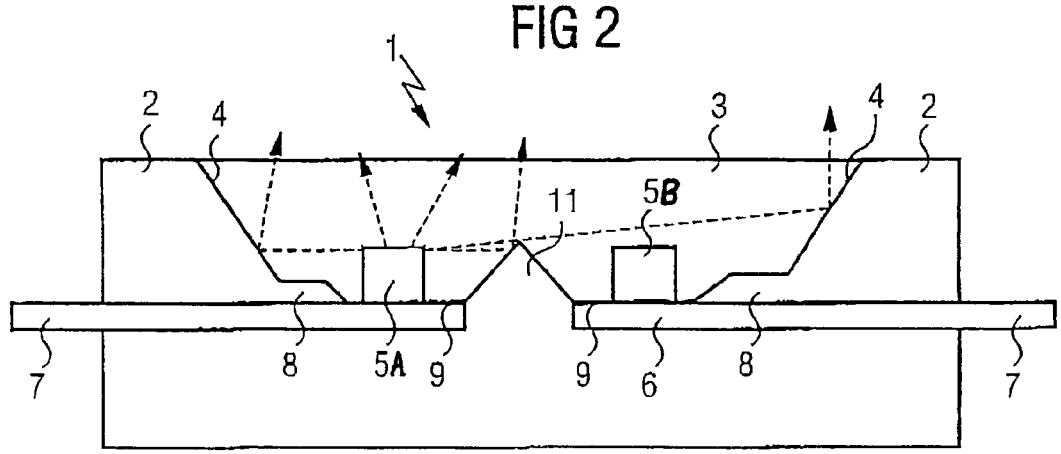
FIG. 2, a cross-sectional view taken along the line II-II in FIG. 1.

FIG. 1 shows a top view of a device 1, which is described in further detail below in conjunction with FIGS. 1 and 2. The device 1 has a housing 2 in which a cavity 3 is made. The cavity 3, with its sloped side walls 4, serves as a reflector for the light emitting diode chips 5A, 5B and 5C (referenced jointly as diode chips 5) which are arranged in the cavity 3. The light emitting diode chips 5 are arranged on a leadframe 6, whose connection elements 7 protrude laterally out of the housing 2. Some portions of the leadframe 6 are located beneath cover layers 8, which serve to fix the leadframe 6. The leadframe 6 is furthermore subdivided into individual mounting areas 9 for the light emitting diode chips 5 and bond pads 10 for the bond wires used for bonding the light emitting diode chips 5. The bond wires used for connecting the light emitting diode chips 5 are not shown in FIGS. 1 and 2.

In the arrangement shown in FIG. 1, there are several sets of adjacent diode chips. Thus, diode chips 5A, 5B are adjacent, as are 5A, 5C and 5B, 5C.

The light emitting diode chips 5 are arranged in the housing 2 typically with an interval spacing of 0.8 mm, measured from the center of each light emitting diode chip 5, respectively. Between the mounting areas 9 for the light emitting diode chips 5 is a gap approximately 0.2 mm wide. In the exemplary embodiment shown in FIGS. 1 and 2, the gap in the leadframe 6 between adjacent mounting areas 9 is occupied by the partition 11, whose walls have a wedge-shaped cross section. The direct-sight contact between the light emitting diode chips 5 is interrupted by the partition 11. The radiation originating from one of the light emitting diode chips 5 can therefore not be absorbed directly by one of the other light emitting diode chips 5. For this reason, the light yield of the device 1 is approximately equal to the sum of the light yields of the individual light emitting diode chips 5.

Because of the wedge-shaped cross section of the partition 11, it is assured that the light striking the partition 11 will be reflected outward. The height of the partition 11 should advantageously be up to 25% and preferably up to 10% above the height of the light emitting diode chips 5. The height is measured in each case from the bottom of the cavity 3 upward. If the height of the partition 11 is lower than the height of the light emitting diode chips 5, the line of sight between the light emitting diode chips 5 will not be completely interrupted. Conversely, if the height of the partition 11 is too great, then the partition takes up too much space, because of its wedge-shaped walls. Accordingly, it is the radiation characteristic of each light emitting diode chip 5, respectively, that is definitive for the height of the partition 11. If the light emitting diode chips 5 primarily radiate downward, then the height of the partition 11 can also be less than the height of the light emitting diode chips 5.

For producing the device 1, first the leadframe 6 is injection-molded with a thermoplastic or thermosetting plastic to produce housing 2 along with partition 11, and then the light emitting diode chips 5 are set down on the mounting areas 9 and bonded. Alternatively, the partition may be formed onto the housing after the housing has been molded. Next, the cavity 3 is filled with a resin that is transparent to the radiation of the light emitting diode chips 5.

It should be noted that the same method can be employed if the leadframe 6 is replaced by a complete printed circuit board. In that case, in the region of the light emitting diode chips 5, the printed circuit board is provided with a housing 2 that is injection-molded onto the printed circuit board.

FIG. 3 shows a cross-sectional view through a modified exemplary embodiment of the device 1. In this exemplary embodiment, the housing 2 is first formed and then the requisite conductor tracks 12 are made on the surface of the housing 2. For that purpose, what is known as the CIMID (Chip in Molded Interconnection Device) technique can be employed. The CIMID technique is disclosed in EP 0 645 953 B1, which is hereby incorporated by reference.

According to this technique, a thin metal film is first deposited in an aqueous solution on the surface of the housing 2, and it is then patterned using a laser. The thus-structured metal film is then thickened by electroplating. Using this method has the advantage that the partition 11 can likewise be coated with a reflective metal film. This further improves the efficiency of the device 1.

The invention claimed is:

1. An optoelectronic device, having a plurality of light emitting diode chips which are arranged together in a reflector, wherein between any two light emitting diode chips, a partition is arranged, and at least three light emitting diode chips are arranged in the reflector in such a way that they are arranged at the corner points of an imaginary polygon, and partitions extend in starlike fashion apart from one another between the light emitting diode chips.

2. The optoelectronic device of claim 1, wherein the reflector is cast with a synthetic resin that is transparent to the radiation of the light-emitting diode chips.

3. The optoelectronic device of claim 1, wherein the partition is formed by a reflective dividing rib, which has a wedge-shaped cross section.

4. The optoelectronic device of claim 1, wherein the light emitting diode chips are arranged on a leadframe, which extends along the bottom of the reflector.

5. The optoelectronic device of claim 1, wherein the reflector is formed by a cavity in a plastic housing, the light emitting diode chips are secured to conductor tracks, which are formed on the reflector or in the cavity on the housing, and adjacent light emitting diode chips have a spacing from one another of between 0.5 mm and 1 mm, in each case measured from the respective center of each light emitting diode chip.

6. The optoelectronic device of claim 1, wherein the partition is formed onto a plastic housing between any two adjacent light emitting diode chips.

7. The optoelectronic device of claim 1, wherein the spacing between adjacent light emitting diode chips is 0.8 mm.

8. The optoelectronic device of claim 1, wherein said partition is positioned between adjacent light emitting diode chips.

9. The optoelectronic device of claim 8, wherein said partition is positioned between every set of adjacent light emitting diodes in the reflector.

10. The optoelectronic device of claim 9, wherein said partition is positioned to block light along a line of sight from each one of the light emitting diode chips to every other one of the light emitting diode chips.

11. The optoelectronic device of claim 5, wherein the height of the partition is up to 10% above the height of the light emitting diode chips.

12. An optoelectronic device, having a plurality of light emitting diode chips which are arranged together in a reflector, wherein between any two light emitting diode chips, a partition is arranged, and the height of the partition is higher than the height of the light emitting diode chips by up to 25% above the height of the light emitting diode chips.

13. An optoelectronic device, having a plurality of light emitting diode chips, which are arranged together in a reflector,
wherein between any two light emitting diode chips, a partition is arranged; the reflector is formed by a cavity in a plastic housing; the reflector is cast with a synthetic resin that is transparent to the radiation of the light-emitting diode chips; the partition is formed by a reflective dividing rib, which has a wedge-shaped cross section; the height of the partition is up to 10% above the height of the light emitting diode chips; and at least three light emitting diode chips are arranged in the reflector in such a way that they are arranged at the corner points of an imaginary polygon, and partitions extend in starlike fashion apart from one another between the light emitting diode chips.

14. The optoelectronic device of claim 13, wherein said partition is positioned between adjacent light emitting diode chips.

15. The optoelectronic device of claim 14, wherein said partition is positioned between every set of adjacent light emitting diodes in the reflector.

16. The optoelectronic device of claim 15, wherein said partition is positioned to block light along a line of sight from each one of the light emitting diode chips to every other one of the light emitting diode chips.

17. An optoelectronic device, having a plurality of light emitting diode chips, which are arranged together in a reflector,
wherein between any two light emitting diode chips, a partition is arranged; the reflector is formed by a cavity in a plastic housing; the reflector is cast with a synthetic resin that is transparent to the radiation of the light-emitting diode chips; adjacent light emitting diode chips have a spacing from one another of between 0.5 mm and 1 mm, in each case measured from the respective center of each light emitting diode chip; at least three light emitting diode chips are arranged in the reflector in such a way that they are arranged at the corner points of an imaginary polygon, and partitions extend in starlike fashion apart from one another between the light emitting diode chips.

18. The optoelectronic device of claim 17, wherein the spacing between adjacent light emitting diode chips is 0.8 mm.

19. The optoelectronic device of claim 17, wherein said partition is positioned between adjacent light emitting diode chips.

20. The optoelectronic device of claim 19, wherein said partition is positioned between every set of adjacent light emitting diodes in the reflector.

21. The optoelectronic device of claim 20, wherein said partition is positioned to block light along a line of sight from each one of the light emitting diode chips to every other one of the light emitting diode chips.

22. An optoelectronic device, having a plurality of light emitting diode chips, which are arranged together in a reflector,
wherein between any two light emitting diode chips, a partition is arranged; the reflector is formed by a cavity in a plastic housing; the reflector is cast with a synthetic resin that is transparent to the radiation of the light-emitting diode chips; the partition is formed by a reflective dividing rib, which has a wedge-shaped cross section; and at least three light emitting diode chips are arranged in the reflector in such a way that they are arranged at the corner points of an imaginary polygon, and partitions extend in starlike fashion apart from one another between the light emitting diode chips.

* * * * *